(12) United States Patent
Hiller et al.

(10) Patent No.: US 7,858,403 B2
(45) Date of Patent: Dec. 28, 2010

(54) METHODS AND SYSTEMS FOR FABRICATING BROAD SPECTRUM LIGHT EMITTING DEVICES

(75) Inventors: Norbert Hiller, Chapel Hill, NC (US); Scott Schwab, Durham, NC (US); Gerald H. Negley, Hillsborough, NC (US)

(73) Assignee: Cree, Inc., Durham, NC (US)

( * ) Notice: Subject to any disclaimer, the term of this patent is extended or adjusted under 35 U.S.C. 154(b) by 88 days.

(21) Appl. No.: 10/267,093

(22) Filed: Oct. 4, 2002

(65) Prior Publication Data

US 2003/0089918 A1 May 15, 2003

Related U.S. Application Data

(60) Provisional application No. 60/335,649, filed on Oct. 31, 2001.

(51) Int. Cl.
*H01L 21/66* (2006.01)
(52) U.S. Cl. .................. 438/16; 257/E33.061
(58) Field of Classification Search ......... 257/183–184, 257/432, 444, 79–103, E33.001, E33.055, 257/E33.06, E33.061; 438/48, 78, 79, 14–18, 438/22–47; 362/293; 313/498, 502; 445/1, 445/3
See application file for complete search history.

(56) References Cited

U.S. PATENT DOCUMENTS

| | | | | |
|---|---|---|---|---|
| 3,910,701 A * | 10/1975 | Henderson et al. | ............. | 356/39 |
| 4,918,497 A | 4/1990 | Edmond | ...................... | 357/17 |
| 4,966,862 A | 10/1990 | Edmond | ..................... | 437/100 |
| 5,027,168 A | 6/1991 | Edmond | ...................... | 357/17 |
| 5,210,051 A | 5/1993 | Carter, Jr. | ................... | 437/107 |
| 5,338,944 A | 8/1994 | Edmond et al. | ................ | 257/76 |
| 5,393,993 A | 2/1995 | Edmond et al. | ................ | 257/77 |
| 5,416,342 A | 5/1995 | Edmond et al. | ................ | 257/76 |
| 5,523,589 A | 6/1996 | Edmond et al. | ................ | 257/77 |
| 5,541,525 A | 7/1996 | Wood et al. | ................. | 324/755 |

(Continued)

FOREIGN PATENT DOCUMENTS

EP    1139440 A2    10/2001

(Continued)

OTHER PUBLICATIONS

U.S. Appl. No. 60/294,378, entitled *Light Emitting Didode Structure With Multi-Quantum Well and Superlattice Structure*, filed May 30, 2001.

(Continued)

*Primary Examiner*—Minh-Loan T Tran
*Assistant Examiner*—Kevin Quinto
(74) *Attorney, Agent, or Firm*—Myers Bigel Sibley & Sajovec, P.A.

(57) ABSTRACT

Broad spectrum light emitting devices and methods and systems for fabricating such devices are provide. Such devices may include a light emitting element, such as a diode or laser, which emits light in a predefined range of frequencies, and luminous material on the light emitting diode. The characteristics of the luminous material, such as the amount, composition and/or doping of the luminous material or materials may be based on measured light output of the light emitting device, such as the measured output frequency and/or power of the light emitting device.

17 Claims, 5 Drawing Sheets

U.S. PATENT DOCUMENTS

| | | | |
|---|---|---|---|
| 5,604,135 A | 2/1997 | Edmond et al. | 437/22 |
| 5,631,190 A | 5/1997 | Negley | 438/33 |
| 5,739,554 A | 4/1998 | Edmond et al. | 257/103 |
| 5,898,185 A | 4/1999 | Bojarczuk, Jr. et al. | 257/103 |
| 5,912,477 A | 6/1999 | Negley | 257/95 |
| 5,952,681 A | 9/1999 | Chen | 257/89 |
| 5,962,971 A | 10/1999 | Chen | 313/512 |
| 5,998,805 A * | 12/1999 | Shi et al. | 257/40 |
| 6,120,600 A | 9/2000 | Edmond et al. | 117/89 |
| 6,187,606 B1 | 2/2001 | Edmond et al. | 438/46 |
| 6,201,264 B1 | 3/2001 | Khare et al. | 257/97 |
| 6,245,259 B1 | 6/2001 | Höhn et al. | 252/301.36 |
| 6,303,916 B1 * | 10/2001 | Gladnick | 250/205 |
| 6,344,661 B1 * | 2/2002 | Nagase et al. | 257/40 |
| 6,395,564 B1 * | 5/2002 | Huang | 438/7 |
| 6,635,503 B2 | 10/2003 | Andrews et al. | 438/27 |
| 2002/0047631 A1 * | 4/2002 | Pederson | 315/291 |
| 2002/0122444 A1 * | 9/2002 | Tsai | 372/18 |
| 2002/0123164 A1 | 9/2002 | Slater, Jr. et al. | 438/39 |
| 2002/0171911 A1 | 11/2002 | Maegawa | |
| 2003/0006418 A1 | 1/2003 | Emerson et al. | 257/79 |
| 2004/0056260 A1 | 3/2004 | Slater, Jr. et al. | 257/79 |

FOREIGN PATENT DOCUMENTS

| | | | |
|---|---|---|---|
| JP | 61-39541 A | | 2/1986 |
| JP | 8-162512 A | | 6/1996 |
| JP | 11-46019 A | | 2/1999 |
| JP | 2001-107036 A | | 4/2001 |
| JP | 2001-177158 A | * | 6/2001 |
| JP | 2002-246654 | | 8/2002 |
| JP | 2002-344029 A | | 11/2002 |
| WO | WO 97/48138 | | 12/1997 |
| WO | WO 00/12649 | | 3/2000 |

OTHER PUBLICATIONS

U.S. Appl. No. 60/294,308, entitled *Light Emitting Didode Structure With Superlattice Structure*, filed May 30, 2001.

English Translation—Official Notice of Rejection, JP Application No. 2003-541058, Jan. 13, 2009.

English language translation of Official Notice of Rejection, Japanese Patent Application No. 2003-541058, Jun. 16, 2009.

* cited by examiner

METHODS AND SYSTEMS FOR FABRICATING BROAD SPECTRUM LIGHT EMITTING DEVICES

RELATED APPLICATIONS

The present application is related to and claims priority from U.S. Provisional Application Ser. No. 60/335,649, filed Oct. 31, 2001, entitled "Broad Spectrum Light Emitting Devices and Methods and Systems For Fabricating the Same," the disclosure of which is incorporated herein by reference as if set forth fully herein.

FIELD OF THE INVENTION

The present invention relates to semiconductor devices, and more particularly to semiconductor devices for producing light.

BACKGROUND OF THE INVENTION

Broad spectrum light emitting semiconductor devices have conventionally been fabricated by exciting a luminous substance with a relatively narrow spectrum light source. Conventionally, in such devices a light emitting diode (LED) or laser emits light in a narrow spectrum which is shifted and/or spread to provide a broader spectrum of light. Typically, it is desirable to provide white light from a narrow spectrum light source, such as an LED or laser. Such white light sources are described, for example, in U.S. Pat. No. 6,245,259, the disclosure of which is incorporated herein by reference as if set forth fully herein.

One difficulty with the fabrication of white light devices is that, typically, the spectrum of light emitted by the devices is dependent on the spectrum of light emitted by the laser or LED and the amount of luminous substance on the device. On a single wafer or die there may be variations in the wavelength of light emitted by the particular devices on the wafer or die. Such deviations may, for example, be the result of defects in the devices or variations as a result of manufacturing tolerances. These deviations in the output wavelength of the underlying devices may result in variations in the white light emitted by the resulting devices after application and excitation of the luminous substance.

SUMMARY OF THE INVENTION

Embodiments of the present invention provide broad spectrum light emitting devices and methods and systems for fabricating such devices. Such devices may include a light emitting element, such as a diode or laser, which emits light in a predefined range of frequencies, and an amount of luminous material on the light emitting diode. The amount of luminous material may be based on a measured output of the light emitting element and/or the light emitting device.

In particular embodiments of the present invention, light emitting elements are coated with a first layer of luminous material and activated and the output frequency of the devices measured. A map of the variations of output frequency of the devices is generated based on the measurements and additional luminous material is selectively applied to the light emitting elements based on the map of variations so as to provide a plurality of broadband light emitting devices have a desired uniformity, such as a substantially uniform light output. Additionally, the measurement and application operations may be repeated multiple times until a desired uniformity of light output is achieved.

Alternatively, the frequency of the output of the individual devices could be measured before the initial application of the luminous material and the initial application could be adjusted based on the measurement. The light emitting elements could be individually activated, activated in groups or all activated for measurement.

In further embodiments of the present invention, the light emitting elements are gallium nitride based devices. Preferably, the light emitting elements are fabricated on a silicon carbide substrate such that the light is emitted through the silicon carbide substrate. The silicon carbide substrate may be patterned to enhance light emission of the light emitting elements. Furthermore, in some embodiments, the light emitting elements have two contacts accessible from a single side of the device. In such a case, the devices may be activated in parallel by placing the devices on a foil or other conductor and contacting the devices through the foil.

The luminous material is preferably a phosphor, such as YAG:Ce. The luminous material may be applied by one or more of dusting a charged surface of the light emitting elements, suspending the phosphor in a fluid and applying the fluid to the devices, air brushing the phosphor on the devices and/or applying the phosphor with an ink or bubble jet. The same application technique may be used for the initial and subsequent application or differing techniques may be utilized.

In particular embodiments of the present invention, a broad spectrum light emitting device is fabricated by measuring light output of the light emitting device and selectively applying luminous material to the light emitting device based on the measured light output of the light emitting device. The selective application of luminous material may be provided by selectively applying an amount of luminous material to the light emitting device, by selectively applying different compositions of luminous material to the light emitting device and/or by selectively applying differing doping levels of luminous material to the light emitting device based on the measured light output of the light emitting device.

In further embodiments of the present invention, light output of the light emitting device is measured after applying a coating of luminous material to the light emitting device. The measurement of light output and the selective application of luminous material may also be repeated until the measured light output of the light emitting device meets a predefined criteria.

Furthermore, the selective application of luminous material may be preceded by singulating the light emitting device from a wafer having a plurality of light emitting devices. If such is the case, the singulated light emitting devices may be grouped based on measured light output of respective ones of the singulated light emitting devices and different amounts of luminous material, differently doped luminous material and/or different composition luminous material applied to different groups of the singulated light emitting devices.

In particular embodiments of the present invention, the selective application of luminous material is provided by selectively applying luminous material utilizing at least one of an inkjet application process, an air brush application process, a fluid application process, electrostatic deposition, electrophoretic deposition, screen printing, dipping, roll coating and/or vacuum deposition.

In certain embodiments of the present invention, the light emitting device is a light emitting device on a wafer having a plurality of light emitting devices.

In still further embodiments of the present invention, broad spectrum light emitting devices are fabricated by measuring light output of respective ones of a plurality of light emitting devices and selectively applying luminous material to the respective ones of the plurality of light emitting devices based on the measured light output of the respective ones of the light emitting devices. The light output of respective ones of the plurality of light emitting devices may be measured by activating respective ones of the plurality of light emitting devices and measuring light output of the respective ones of the plurality of light emitting devices when the respective ones of the light emitting devices are activated. The light emitting devices may be activated individually, in groups, sequentially and/or in parallel.

In additional embodiment of the present invention, a map of the light output of the respective ones of the light emitting devices is generated and luminous material is selectively applied to respective ones of the plurality of light emitting devices based on the measured light output of the respective ones of the light emitting devices utilizing the generated map. Furthermore, the measurement of light output of the respective ones of the plurality of light emitting devices and the selective application of luminous material may be repeated until a predefined light output criteria is reached. The predefined light output criteria may be a substantially uniform light output of the plurality of light emitting devices. The predefined light output criteria could also be a threshold percentage of the plurality of light emitting devices having a predefined light output. The light output of respective ones of the plurality of light emitting devices may be measured after applying a coating of luminous material to the plurality of light emitting devices. The selective application of luminous material may include applying an amount of luminous material, applying different compositions of luminous material and/or applying differing doping levels of luminous material to the respective ones of the light emitting devices based on the measured light output of the respective ones of the light emitting devices. The luminous material may be selectively applied utilizing an inkjet application process, an air brush application process, a fluid application process, electrostatic deposition, electrophoretic deposition, screen printing, dipping, roll coating and/or vacuum deposition.

In additional embodiments of the present invention, the respective ones of the plurality of light emitting devices are singulated light emitting devices. In such embodiments, the selective application of luminous material may be provided by sorting the singulating light emitting devices based on the measured light output of the light emitting devices so as to group singulated light emitting devices having common measured light output characteristics and selectively applying luminous material to the singulated light emitting devices so as to provide different luminous material characteristics to different groups of singulated light emitting devices.

In further embodiments, the plurality of light emitting devices are a plurality of light emitting devices on a wafer.

In other embodiments of the present invention, a broad spectrum light emitting device includes a light emitting device having measurable optical characteristics and a coating of luminous material on the light emitting device. The coating of luminous material has at least one characteristic selected based on a measurement of the optical characteristics of the light emitting device to provide a predefined output characteristic of the light emitting device.

The coating of luminous material may include a first coating of luminous material applied independent of the measured optical characteristics and a second coating of luminous material applied based on the measured optical characteristics. Furthermore, the first coating and the second coating may be of the same composition luminous material. In such a case, the thickness of the second coating may be selected based on the measured optical characteristics. The first coating and the second coating could also be of different composition luminous material and the composition of the second coating may be selected based on the measured optical characteristics. Furthermore, the doping of the second coating may be selected based on the measured optical characteristics. The measured optical characteristics may also be optical characteristics of the light emitting device with the first coating of luminous material applied.

In still further embodiments of the present invention, the composition of the luminous material, the amount of luminous material and/or the doping of the luminous material are selected based on the measured optical characteristics.

In additional embodiments of the present invention, a broad spectrum light emitting device includes a plurality of light emitting devices on at least a portion of a wafer and coatings of luminous material on respective ones of the plurality of light emitting devices, the coatings of luminous material on the respective ones of the plurality of light emitting devices having different characteristics. The different characteristics may be at least one of different amounts of luminous material, different dopings of a luminous material and/or different compositions of luminous material.

Furthermore, the coatings of luminous material may include a first coating of luminous material on each of the respective ones of the plurality of light emitting devices and a second coating of luminous material applied based on a measured optical characteristic of respective ones of the plurality of light emitting devices. The first coating and the second coating may be of the same composition luminous material and the thickness of the second coating may be selected based on the measured optical characteristics. The first coating and the second coating could also be of different composition luminous material and the composition of the second coating may be selected based on the measured optical characteristics. Furthermore, the doping of the second coating may be selected based on the measured optical characteristics. Furthermore, the measured optical characteristics may be optical characteristics of respective ones of the light emitting devices with the first coating of luminous material applied.

In other embodiments of the present invention, the composition of the coating of luminous material differs between the respective ones of the plurality of light emitting devices based on measured optical characteristics of the respective ones of the plurality of light emitting devices. Furthermore, the thickness of the coating of luminous material may differ between the respective ones of the plurality of light emitting devices based on measured optical characteristics of the respective ones of the plurality of light emitting devices. Also, the doping of the coating of luminous material may differ between the respective ones of the plurality of light emitting devices based on measured optical characteristics of the respective ones of the plurality of light emitting devices.

In still further embodiments of the present invention, a system for fabricating broad spectrum light emitting devices includes a lighting element activation circuit configured to activate light emitting devices, an output measurement circuit configured to measure the light output by the activated light emitting devices, a luminous material application device configured to selectively applying luminous material to light emitting devices and a controller operably associated with the output measurement circuit and the luminous material application device and configured to control the luminous material application device to selectively apply luminous material to light emitting devices based on the measured light output of the activated light emitting devices. In certain embodiments, the luminous material application device is at least one of an inkjet application system, an air brush application system, a fluid application system, an electrostatic deposition system, an electrophoretic deposition system, a screen printing system, a dipping system, a roll coating system and/or vacuum deposition system.

Furthermore, the controller may also be configured to control the luminous material application device to apply a coating of luminous material prior to measurement of the output of the activated light emitting devices. The luminous material application device may also be configured to selectively apply at least one of different amounts of luminous material, different dopings of luminous material and/or different compositions of luminous material.

DETAILED DESCRIPTION OF THE PREFERRED EMBODIMENTS

The present invention now will be described more fully hereinafter with reference to the accompanying drawings, in which embodiments of the invention are shown. This invention, however, should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 1:
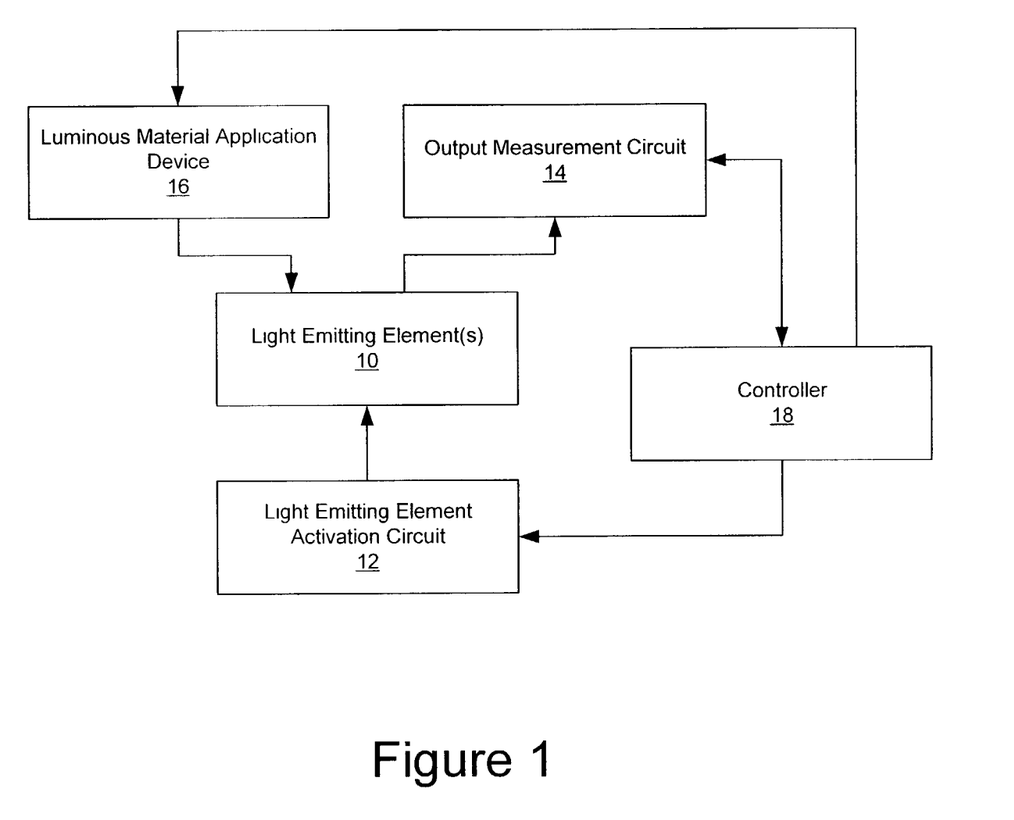
FIG. 1 is a block diagram of a system for applying luminous materials suitable for use in carrying out operations according to embodiments of the present invention.

FIG. 1 illustrates a system that may be utilized to fabricate broad spectrum light emitting devices according to embodiments of the present invention. As illustrated in FIG. 1, a plurality of light emitting elements 10 are provided. Preferably, the light emitting elements comprise LEDs or lasers and are provided on a wafer and/or die such that the light emitting elements may be activated either individually or collectively. The LEDs and/or lasers may have contacts on opposite sides of the device or may have two contacts on a single side of the device.

For example, the light emitting elements may be gallium nitride based LEDs or lasers fabricated on a silicon carbide substrate such as those devices manufactured and sold by Cree, Inc. of Durham, N.C. For example, the present invention may be suitable for use with LEDs and/or lasers as described in U.S. Pat. Nos. 6,201,262, 6,187,606, 6,120,600, 5,912,477, 5,739,554, 5,631,190, 5,604,135, 5,523,589, 5,416,342, 5,393,993, 5,338,944, 5,210,051, 5,027,168, 5,027,168, 4,966,862 and/or 4,918,497, the disclosures of which are incorporated herein by reference as if set forth fully herein. Other suitable LEDs and/or lasers are described in U.S. Provisional Patent Application Serial No. 60/294,378, entitled "LIGHT EMITTING DIDODE STRUCTURE WITH MULTI-QUANTUM WELL AND SUPERLATTICE STRUCTURE", U.S. Provisional Patent Application Serial No. 60/294,445, entitled "MULTI-QUANTUM LIGHT EMITTING DIODE STRUCTURE" and U.S. Provisional Patent Application Serial No. 60/294,308, entitled "LIGHT EMITTING DIDODE STRUCTURE WITH SUPERLATTICE STRUCTURE", each filed May 30, 2001, U.S. patent application Ser. No. 10/140,796, entitled "GROUP III NITRIDE BASED LIGHT EMITTING DIODE STRUCTURES WITH A QUANTUM WELL AND SUPERLATTICE, GROUP III NITRIDE BASED QUANTUM WELL STRUCTURES AND GROUP III NITRIDE BASED SUPERLATTICE STRUCTURES", filed May 7, 2002, as well as U.S. Provisional Patent Application Serial No. 10/057,82, entitled "LIGHT EMITTING DIODES INCLUDING SUBSTRATE MODIFICATIONS FOR LIGHT EXTRACTION AND MANUFACTURING METHODS THEREFOR" filed Jul. 23, 2001 and U.S. patent application Ser. No. 10/057,82, filed Jan. 25, 2002 entitled "LIGHT EMITTING DIODES INCLUDING SUBSTRATE MODIFICATIONS FOR LIGHT EXTRACTION AND MANUFACTURING METHODS THEREFOR." the disclosures of which are incorporated herein as if set forth fully. Furthermore, phosphor coated LEDs, such as those described in U.S. Provisional Application Ser. No. 60/411,980 entitled "PHOSPHOR-COATED LIGHT EMITTING DIODES INCLUDING TAPERED SIDEWALLS, AND FABRICATION METHODS THEREFOR," filed Sep. 19, 2002, the disclosure of which is incorporated by reference herein as if set forth full, may also be suitable for use in embodiments of the present invention.

The LEDs and/or lasers may be configured to operate in a "flip-chip" configuration such that light emission occurs through the substrate. In such embodiments, the substrate may be patterned so as to enhance light output of the devices as is described, for example, in U.S. Provisional Patent Application Ser. No. 60/307,235 filed Jul. 23, 2001 entitled "LIGHT EMITTING DIODES INCLUDING SUBSTRATE MODIFICATIONS FOR LIGHT EXTRACTION AND MANUFACTURING METHODS THEREFOR" or as described in U.S. patent application Ser. No. 10/057,821, filed Jan. 25, 2002, entitled "LIGHT EMITTING DIODES INCLUDING SUBSTRATE MODIFICATIONS FOR LIGHT EXTRACTION AND MANUFACTURING METHODS THEREFOR," the disclosures of which are incorporated herein by reference as if set forth fully herein. As is further illustrated in FIG. 1, a light emitting element activation circuit 12 is also provided. The light emitting element activation circuit 12 activates the light emitting elements 10 so that the light emitting elements 10 emit light. Such activation may be performed individually in a sequential fashion or simultaneously activating some or all of the light emitting elements 10. Similarly, subsets of the plurality of light emitting elements 10 could be activated. The particular technique for activating the light emitting elements 10 may depend on the configuration of the electrodes for the light emitting elements 10, the nature of the output measurement circuit 14 which measures the output of the light emitting elements 10 and/or the manner in which the luminous material is applied to the light emitting elements 10. For example, in embodiments where the light emitting elements have two contacts accessible from a single side of the device, the devices may be activated in parallel by placing the devices on a foil or other conductor and contacting the devices through the foil.

The output measurement circuit 14 measures the light output of one or more of the light emitting elements 10 and provides this information to a controller 18. The controller 18 utilizes the light output information to control the luminous material application device 16 that selectively applies luminous material to the light emitting elements 10 based on the measured light output of the light emitting elements 10. The output measurement circuit 14 may be a spectrum analyzer or other such device for analyzing the frequency and/or power of light output of the light emitting elements 10. Such devices are known to those of skill in the art and, therefore, need not be described further herein.

The luminous material application device 16 provides means for selectively applying a luminous material, including phosphors such as YAG:Ce or the like. Such means 16 for selectively applying a luminous material may be provided by, for example, an inkjet application system, an air brush application system, a fluid application system, a dust application system utilizing charged particles which are attracted to light emitting elements having an opposite charge (electrostatic deposition), electrophoretic deposition, screen printing, dipping, roll coating and/or vacuum deposition and/or other suitable techniques known to those of skill in the art. The selective application of luminous material may be provided before or after singulation of the devices. Differing amounts of luminous material may be applied to differing devices before or after singulation utilizing application techniques that provide for the selective application of luminous materials to individual devices or groups of devices. For example, if selective application is provided before singulation, an inkjet or other such selective application system may provide differing amounts of luminous material to individual or groups of devices while the devices remain on a wafer. After singulation, individual devices could have specific amounts of luminous material applied by, for example, an inkjet process, electrostatic deposition or the like. For example, differing charges could be applied to singulated or non-singulated devices in an electrostatic process such that differing amounts of luminous material would be attracted to different devices based on the charge of the device. Alternatively, if selective application is provided after singulation, the singulated devices (dies) may be grouped based on common measured output characteristics and a common amount of luminous material applied to each of the devices in the group. Furthermore, application of the luminous material may occur before or after a device or devices are mounted to a submount.

Finally, the controller 18 may be any suitable controller capable of coordinating the operations as described herein for selectively applying luminous material to light emitting elements. For example, the controller 18 may be a programmable microcontroller, a personal computer or other data processing system.

Figure 2:
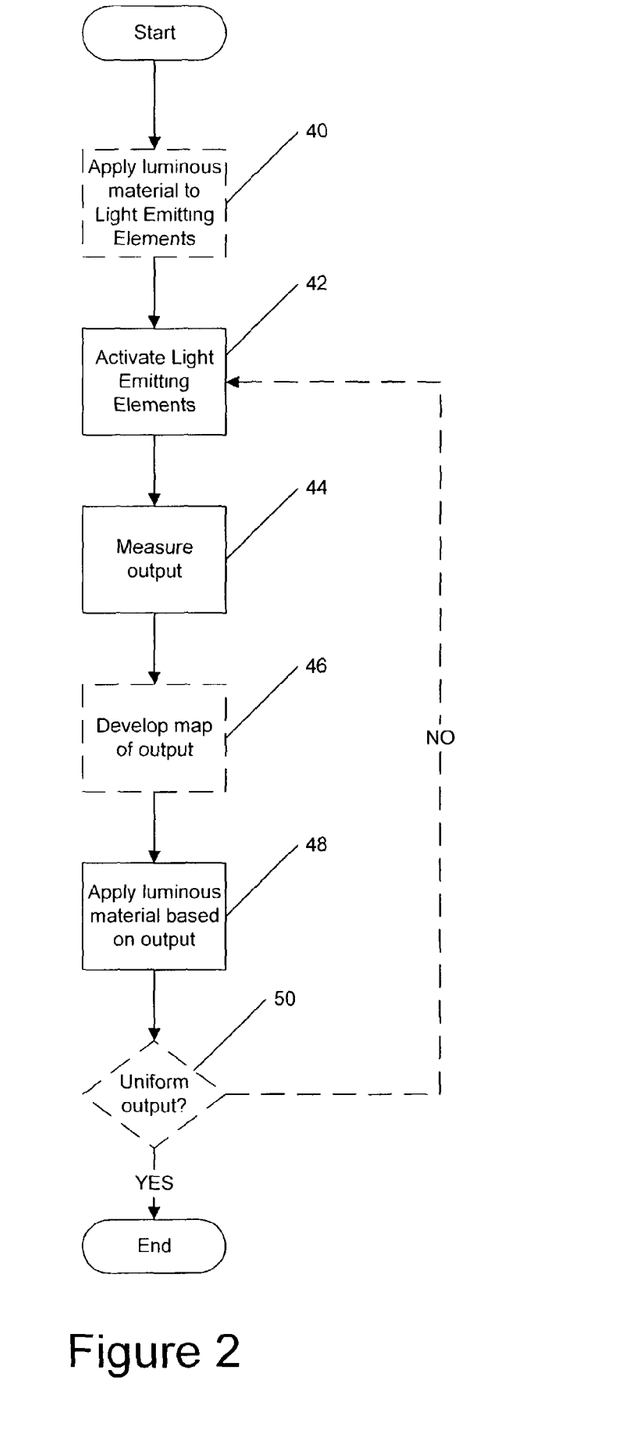
FIG. 2 is a flowchart illustrating operations according to embodiments of the present invention.
Figure 3A:
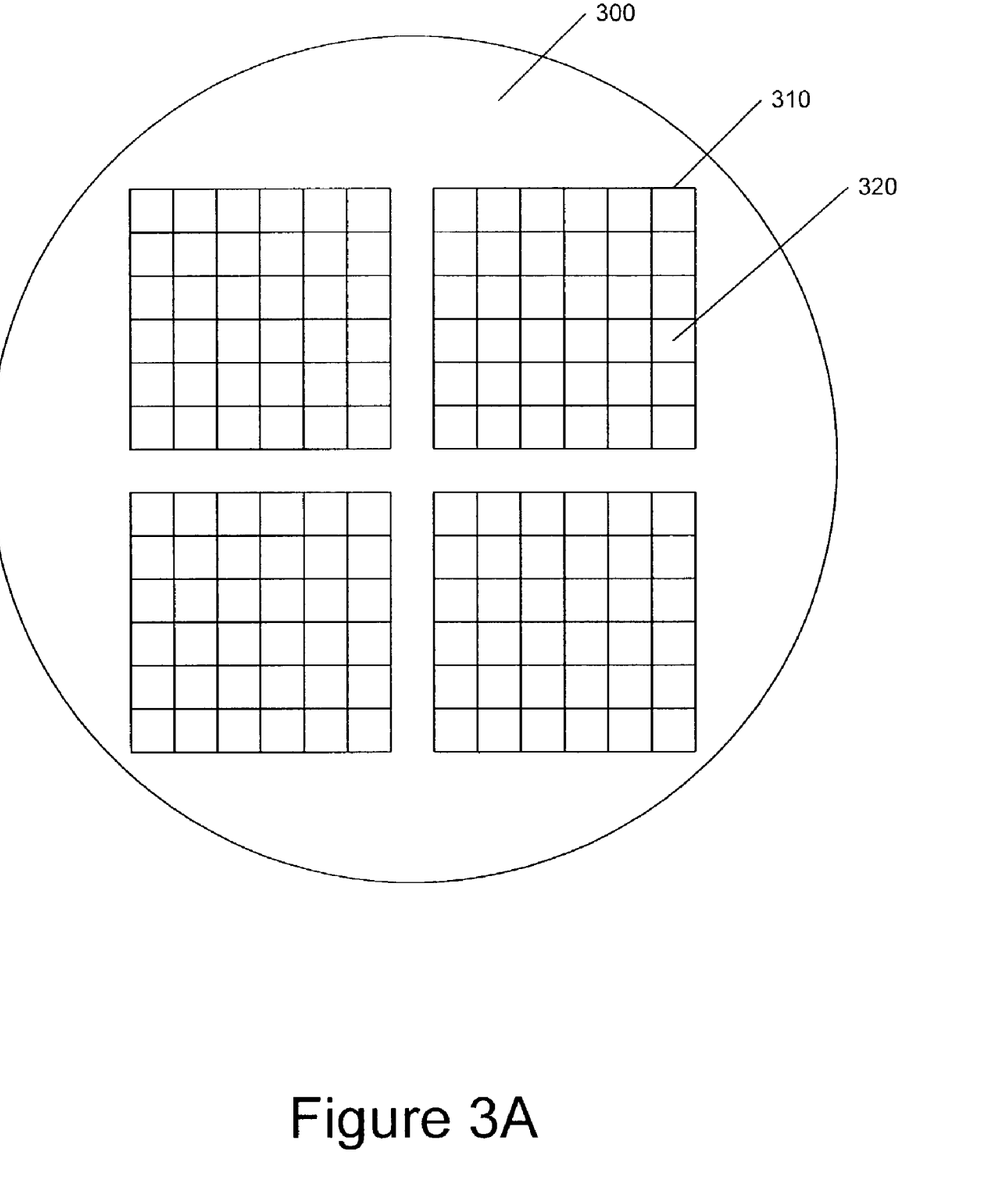
FIGS. 3A and 3B are illustrations of wafers having selectively applied luminous materials according to embodiments of the present invention.

FIG. 2 illustrates operations according to certain embodiments of the present invention. The operations of FIG. 2 will be described with reference to FIGS. 3A and 3B. FIG. 3A is an illustration of a wafer 300 having several regions 310 containing a plurality of light emitting elements 320 prior to processing according to embodiments of the present invention. As seen in FIG. 2, optionally, an initial coating of the luminous material is applied to the light emitting elements 320 (block 40). This initial coating may be applied by the techniques described above, for example, by flowing a fluid containing the luminous material onto the wafer 300 to cover the regions 310, by inkjet application of the luminous material, by air brush application of the material and/or by dusting the wafer 300 when the surface of the wafer is charged or other such techniques for application of a luminous material to a light emitting element as will be understood by those of skill in the art. Such an application may, for example, be provided by the luminous material application device 16 under control of the controller 18.

As is further seen in FIG. 2, the light emitting elements 320 are activated (block 42) and the output of the light emitting elements 320 is measured (block 44). Such activation, for example, may be provided by the light emitting element activation circuit 12 contacting electrodes of the light emitting elements, either in parallel, in groups, and/or individually, such that a forward electrical bias may be applied to the light emitting elements 320 when the light emitting element activation circuit 12 is instructed to do so by the controller 18. Such activation of the light emitting elements 320 may be performed simultaneously, sequentially by individual elements and/or sequentially by groups of elements. For example, the entire wafer 300 could be activated and the output of the light emitting elements 320 measured, each region 310 could be individually activated and its output measured and/or each element 320 could be individually activated and its output measured.

Furthermore, the output of the light emitting elements 320 may be measured at differing resolutions. For example, the output of each individual light emitting element could be measured or the output of groups of light emitting elements 320 could be measured. In certain embodiments of the present invention, the resolution of the light output measurement as well as the resolution to which luminous material may be applied correspond to the size of an individual light emitting element 320. However, in other embodiments of the present invention, the resolution of the light output measurement may be at least the resolution to which luminous material may be applied to the light emitting elements 320 if such is coarser than an individual light emitting element 320.

As is further seen in FIG. 2, optionally, a map of the output of the light emitting elements 320 may be developed (block 46) to indicate which of the light emitting elements may need additional application(s) of luminous material or the thickness of an initial application of luminous material. The map relates the location of a light emitting element with its output such that a subsequent application of luminous material may be based on the measured output. Such a map may only need to be generated if the measurement of the output of light emitting elements is carried out for multiple light emitting elements prior to the selective application of luminous material in block 48.

Figure 3B:
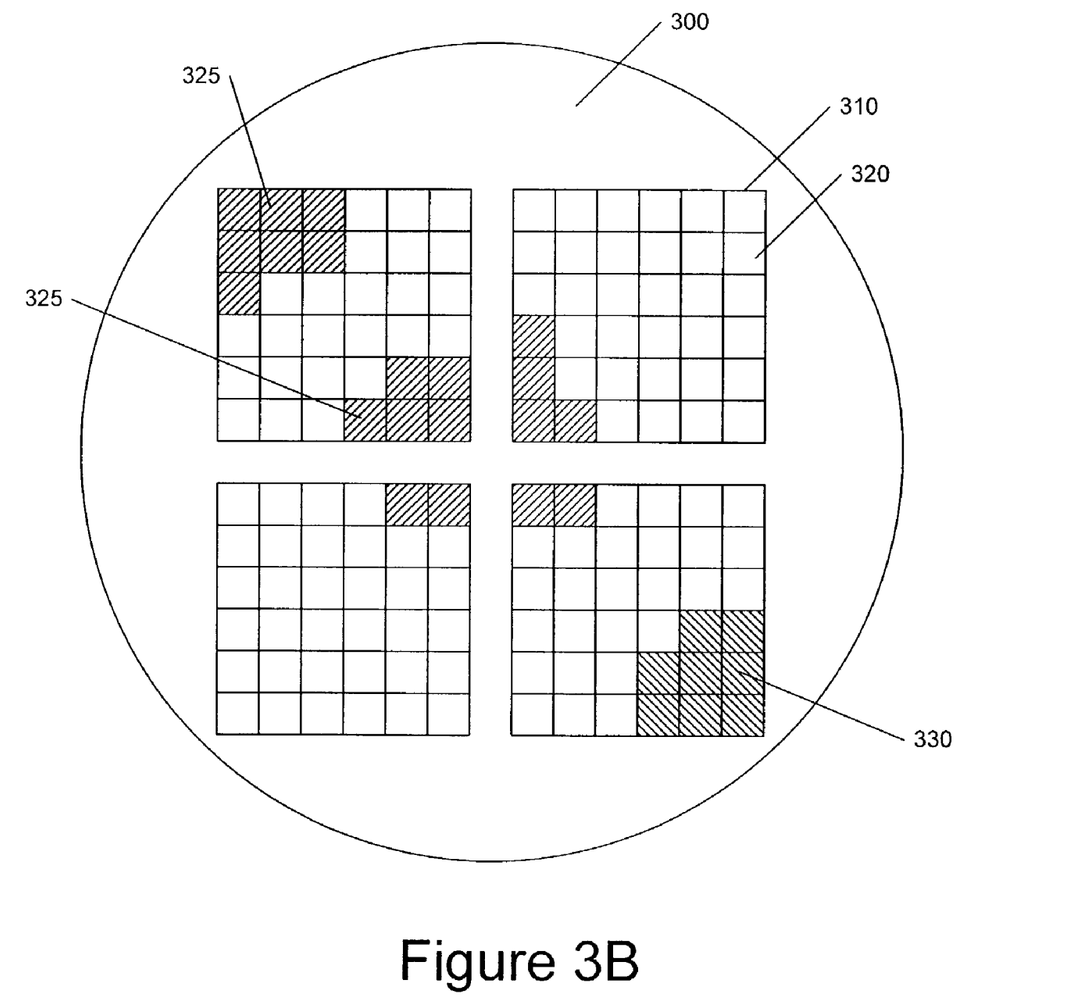

In any event, luminous material is selectively applied to the light emitting elements 320 based on the measured output of the light emitting elements 320 such that different ones of the light emitting elements in the same wafer and/or die may receive differing amounts of luminous material (block 48). For example, as illustrated in FIG. 3B, the output of the light emitting elements 320 may be measured as described above and it is determined that a first subset of light emitting elements 325 (indicated by the right to left diagonal cross-hatch in FIG. 3B) have an output which requires more luminous material be applied to these light emitting elements 325 than the remaining ones of the light emitting elements 320 and a second subset of light emitting elements 330 (indicated by the left to right diagonal cross-hatch in FIG. 3B) have an output which requires less luminous material be applied to these elements 330 than the remaining ones of the light emitting elements 320. The second subset of light emitting elements 330 may then have a first amount of luminous material applied to them, the remaining ones of the light emitting elements 320 may have a second amount of luminous material, greater than the first amount, applied to them and the first subset of light emitting elements 325 may have a third amount of luminous material applied to them, which is greater than the first and the second amounts.

The application of luminous material may be provided by successive passes including a first pass that applies the first amount to all the light emitting elements, a second pass that applies an additional amount to the remaining light emitting elements 320 and the first subset of light emitting elements 325 and a third pass that applies an additional amount of luminous material to only the first subset of light emitting elements 325. Alternatively, a single pass that applies differing amounts of luminous material to the differing subsets of light emitting elements may be carried out. Furthermore, if an initial application of luminous material is provided, then an additional pass or passes applying luminous material may be provided such that the relative amount of luminous material applied to the various light emitting elements provides the second subset of light emitting elements 330 with the least luminous material, the first subset of light emitting elements 325 with the most luminous material and the remaining ones of the light emitting elements 320 with an amount between the amounts of the first subset 325 and the second subset 330. As described above, the application of luminous material may be carried out by one or more of the above described techniques, including inkjet, air brush, or other such techniques.

As is further illustrated in FIG. 2, after application of the luminous material is carried out, the output of the light emitting elements 320 could again be measured and it determined if the output of the light emitting elements 320 has a desired uniformity, such as being substantially uniform (block 50). Such light output may be substantially uniform if it is within acceptable manufacturing tolerances and provides an acceptable yield for the devices. For example, if a 75% yield is considered acceptable for a wafer, then the output may be considered substantially uniform when 75% of the light emitting elements are within the acceptable manufacturing tolerances for light output. In any event, if such substantial uniformity is not achieved (block 50), the operations at blocks 42-50 may be repeated until such uniformity is achieved (block 50).

Figure 4:
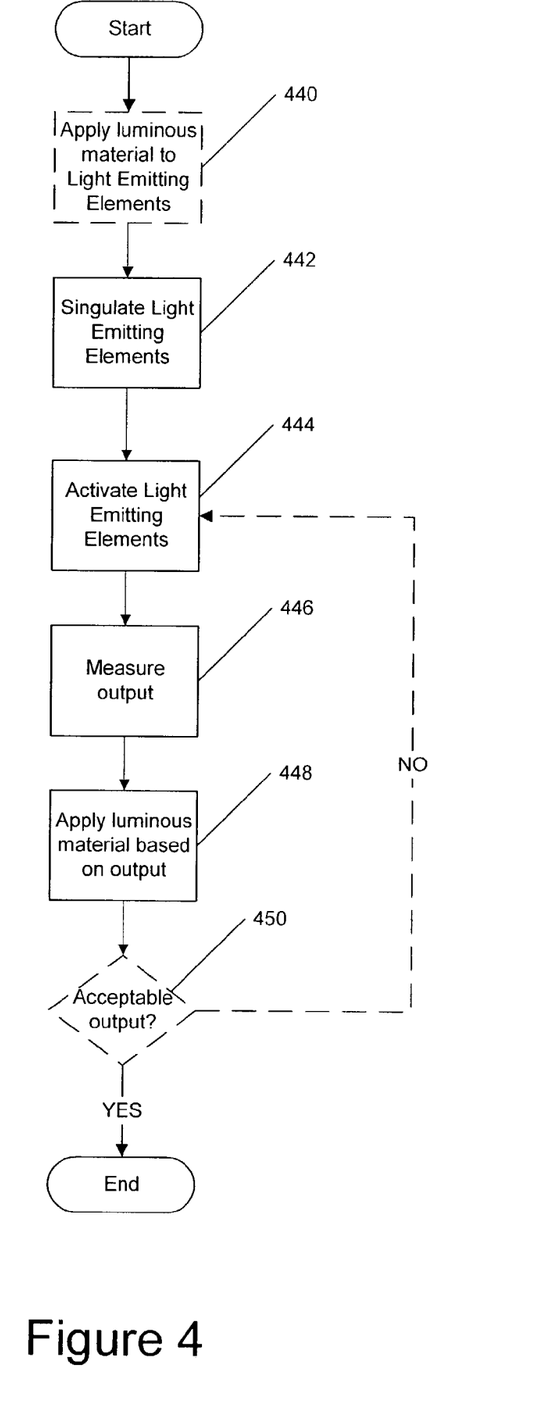
FIG. 4 is a flowchart illustrating operations according to further embodiments of the present invention.

FIG. 4 illustrates operations according to further embodiments of the present invention. As seen in FIG. 4, optionally, an initial coating of the luminous material is applied to light emitting elements on a wafer (block 440). This initial coating may be applied by the techniques described above, for example, by flowing a fluid containing the luminous material onto the wafer, by inkjet application of the luminous material, by air brush application of the material, by dusting the wafer when the surface of the wafer is charged (electrostatic application) or other such techniques for application of a luminous material to a light emitting element as will be understood by those of skill in the art. Such an application may, for example, be provided by the luminous material application device 16 under control of the controller 18.

As is further seen in FIG. 4, the light emitting elements are singulated from the wafer to provide individual or groups of individual light emitting devices (block 442). Such singulation techniques may include sawing, breaking, etching and/or other such techniques known to those of skill in the art. The light emitting devices or groups of devices are activated (block 444) and the output of the light emitting devices is measured (block 446). Such activation, for example, may be provided by the light emitting element activation circuit 12 contacting electrodes of the light emitting elements, either in parallel, in groups, or individually, such that a forward electrical bias may be applied to the light emitting devices when the light emitting element activation circuit 12 is instructed to do so by the controller 18. Such activation of the light emitting elements 320 may be performed simultaneously, sequentially by individual elements or sequentially by groups of elements. Furthermore, in certain embodiments of the present invention, the activation and measurement of light output may be performed prior to singulation. Furthermore, as discussed above, the output of the light emitting devices may be measured at differing resolutions.

Luminous material is selectively applied to the light emitting devices based on the measured output of the light emitting devices such that different ones of the light emitting elements in the same wafer and/or die may receive differing amounts of luminous material (block 448). The application of luminous material may be provided by successive passes or a single pass that applies differing amounts of luminous material to the differing light emitting devices may be carried out.

As is further illustrated in FIG. 4, after application of the luminous material is carried out, the output of the light emitting devices could again be measured and it determined if the output of the light emitting devices or a device has an acceptable output, such as being within a predefined range for the device, for example, the acceptable manufacturing tolerances for light output (block 450). In any event, if acceptable light output is not achieved (block 450), the operations at blocks 444-450 may be repeated until such output is achieved (block 450).

With regard to the particular amount of luminous material to be applied to a particular light emitting element, such amounts may depend on the light emitting element and the luminous material being utilized. Furthermore, the amount of material to be applied in a particular application may vary depending on the measured output of the light emitting element and the luminous material being applied. Techniques for determining the amount of luminous material to be applied based on a particular output of a light emitting element are known to those of skill in the art and, therefore, need not be described further herein. However, according to particular embodiments of the present invention, such a specific determination need not be made as a small incremental amount of material could be added in successive passes to light emitting elements that do not provide the desired output until a desired uniformity is achieved in the light emitting elements. Thus, for example, an initial increment of luminous material could be applied to all, or substantially all, of the light emitting elements and then the light output may be measured. Subsequent increments of luminous material would then only be applied to ones of the light emitting elements which do not meet a predefined light output criteria. The selective incremental application of luminous material could then be continued until either a predefined number of applications had been reached and/or a predefined yield threshold had been achieved.

As is described above, embodiments of the present invention may provide a broad spectrum light emitting device through selective application of a luminous material, such as a phosphor. In particular embodiments of the present invention, a white light emission device is provided by selective application of an amount of a phosphor based on the output characteristics of the individual device. Furthermore, while the present invention has been described with reference to the selective application of an amount of phosphor, in other embodiments of the present invention, the type of phosphor or the doping of the phosphor could be altered based on the measured characteristics of a light emitting device. Thus, for example, a first application of a first phosphor could be followed by a selective application of a second phosphor so as to provide the desired broad spectrum device. Similarly, the particular doping or phosphor applied to a device could be adjusted based on the measured output of the device. Accordingly, embodiments of the present invention should not be construed as limited to varying the amount of a light emitting material but may also be utilized to vary the light emitting material and/or to apply multiple types of light emitting material so as to provide light emitting devices with a desired output spectrum.

Embodiments of the present invention have been described with reference to individual light emitting devices. However, embodiments of the present invention may also be applicable to groups of light emitting elements into a single device, such as described in U.S. patent application Ser. No. 10/058,369 entitled "CLUSTER PACKAGING OF LIGHT EMITTING DIODES," filed Jan. 28, 2002, the disclosure of which is incorporated herein as if set forth fully. Thus, as used herein, the term individual light emitting device is used to refer to devices having a single or multiple light emitting elements.

Additionally, embodiments of the present invention have been described with reference to the selective application of luminous material. However, embodiments of the present invention could also selectively remove luminous material based on a measured light output of a light emitting device. For example, a coating of luminous material could be applied having a thickness corresponding to the maximum thickness required by a light emitting device in a group of devices and then luminous material removed from individual ones of the group based on measured output of the individual light emitting devices. Such a removal may, for example, be provided by laser etching or other such selective removal techniques known to those of skill in the art. Thus, certain embodiments of the present invention may provide for tailoring the characteristics of the luminous material, for example, by selective application or removal, based on a measured light output of an individual light emitting device.

In the drawings, certain operations/acts and or blocks which have been indicated as optional are shown in dashed lines. The presence or lack of such a dashed line shall not, however, be construed as requiring any of the elements of the figures to carry out particular embodiments of the present invention. Furthermore, while a particular breakdown or division of functions has been illustrated in FIGS. 1 and 2, as will be appreciated by those of skill in the art in light of the present disclosure, other divisions of functions may be provided while still benefiting from the teachings of the present invention. Thus, for example, blocks in the block diagram of FIG. 1 may be combined, or additional blocks added, while still falling under the teachings of the present invention. Similarly, additional blocks may be added, blocks combined or operations may be performed in a different sequence than that illustrated in the flowchart illustration of FIG. 2. For example, blocks for illustrating when the light emitting elements 320 are deactivated are not illustrated in FIG. 2 but could be added in various locations such that the light emitting elements 320 were activated during output measurement and deactivated when output is not measured. Thus, the present invention should not be construed as limited to the particular illustrations provided herewith but is intended to cover any such methods, systems or devices utilizing the selective application of luminous materials as described herein.

In the drawings and specification, there have been disclosed typical preferred embodiments of the invention and, although specific terms are employed, they are used in a generic and descriptive sense only and not for purposes of limitation.

That which is claimed is:

1. A method of fabricating a light emitting apparatus, comprising:
   measuring light output of respective ones of a plurality of semiconductor light emitting devices; then
   sorting the semiconductor light emitting devices based on the measured light output of the semiconductor light emitting devices so as to provide a plurality of groups of semiconductor light emitting devices, a respective group comprising a plurality of semiconductor light emitting devices having similar measured light output characteristics; and then
   tailoring luminous material in a respective group of semiconductor light emitting devices in common.

2. The method of claim 1, wherein tailoring luminous material comprises selectively removing a same amount of previously applied luminous material from the semiconductor light emitting devices in the respective group.

3. The method of claim 1, wherein measuring light output of respective ones of a plurality of semiconductor light emitting devices comprises measuring a frequency of light output of respective ones of a plurality of semiconductor light emitting devices.

4. The method of claim 1, wherein measuring light output of respective ones of the plurality of semiconductor light emitting devices is preceded by applying a common coating of luminous material to the plurality of semiconductor light emitting devices.

5. The method of claim 1, wherein the plurality of semiconductor light emitting devices are configured to generate light from electricity and wherein the luminous material is optically excited by the light that is generated by the light emitting devices.

6. The method of claim 1, wherein the plurality of light emitting devices are on a wafer.

7. The method of claim 1, wherein tailoring luminous material comprises selectively applying a same amount of luminous material to the semiconductor light emitting devices in the respective group.

8. The method of claim 7, wherein selectively applying a same amount of luminous material comprises selectively applying different compositions of the same amount of luminous material to the plurality of semiconductor light emitting devices in the respective groups.

9. The method of claim 7, wherein selectively applying a same amount of luminous material comprises selectively applying differing doping levels of the same amount of luminous material to the plurality of semiconductor light emitting devices in the respective groups.

10. The method of claim 7, wherein selectively applying luminous material is preceded by singulating the light emitting devices from a wafer.

11. The method of claim 7, wherein selectively applying a same amount of luminous material comprises selectively applying a same amount of luminous material utilizing at least on of an inkjet application process, an air brush application process, a fluid application process, electrostatic deposition, electrophoretic deposition, screen printing, dipping, roll coating and/or vacuum deposition.

12. The method of claim 1, wherein measuring light output of respective ones of a plurality of semiconductor light emitting devices comprises:
   activating respective ones of the plurality of semiconductor light emitting devices; and
   measuring light output of the respective ones of the plurality of semiconductor light emitting devices when the respective ones of the semiconductor light emitting devices are activated.

13. The method of claim 12, wherein the respective ones of the plurality of semiconductor light emitting devices have two contacts accessible from a single side of the device, and wherein activating respective ones of the plurality of semiconductor light emitting devices comprises:

placing the respective ones of the plurality of semiconductor light emitting devices on a conductive foil; and contacting the respective ones of the plurality of semiconductor light emitting devices through the foil.

14. The method of claim 1, wherein tailoring is followed by:

further measuring light output of the semiconductor light emitting devices in the respective group;

further tailoring luminous material in the respective group of semiconductor light emitting devices in common; and repeating the further measuring and the further tailoring until a predefined light output criteria for the respective group is reached.

15. The method of claim 14, wherein the predefined light output criteria comprises a substantially uniform light output of the plurality of semiconductor light emitting devices in the plurality of groups.

16. The method of claim 1, wherein the light emitting devices are gallium nitride based light emitting devices.

17. The method of claim 16, wherein the light emitting devices include a silicon carbide substrate, wherein light is extracted through the silicon carbide substrate and wherein the luminous material is applied to the silicon carbide substrate.

* * * * *

UNITED STATES PATENT AND TRADEMARK OFFICE
CERTIFICATE OF CORRECTION

| | | |
|---|---|---|
| PATENT NO. | : 7,858,403 B2 | Page 1 of 1 |
| APPLICATION NO. | : 10/267093 | |
| DATED | : December 28, 2010 | |
| INVENTOR(S) | : Hiller et al. | |

It is certified that error appears in the above-identified patent and that said Letters Patent is hereby corrected as shown below:

On the Title Page:
Item (57) Abstract, Line 2: Please correct "are provide." to read -- are provided. --

In the Claims:
Column 12, Line 50: Please correct "least on of" to read -- least one of --

Signed and Sealed this
Twenty-eighth Day of June, 2011

David J. Kappos
*Director of the United States Patent and Trademark Office*